United States Patent
Amla et al.

(10) Patent No.: US 11,930,596 B2
(45) Date of Patent: Mar. 12, 2024

(54) MATERIALS FOR PRINTED CIRCUIT BOARDS

(71) Applicant: Thintronics, Inc., Berkeley, CA (US)

(72) Inventors: Tarun Amla, Berkeley, CA (US); Stefan J. Pastine, Berkeley, CA (US)

(73) Assignee: Thintronics, Inc., Berkeley, CA (US)

( * ) Notice: Subject to any disclaimer, the term of this patent is extended or adjusted under 35 U.S.C. 154(b) by 0 days.

(21) Appl. No.: 18/096,062

(22) Filed: Jan. 12, 2023

(65) Prior Publication Data

US 2023/0309221 A1    Sep. 28, 2023

Related U.S. Application Data

(63) Continuation of application No. 17/700,928, filed on Mar. 22, 2022, now Pat. No. 11,596,066.

(51) Int. Cl.
*H05K 1/03* (2006.01)
*H05K 1/11* (2006.01)

(52) U.S. Cl.
CPC .......... *H05K 1/0373* (2013.01); *H05K 1/115* (2013.01); *H05K 2201/0195* (2013.01); *H05K 2201/0209* (2013.01); *H05K 2201/068* (2013.01)

(58) Field of Classification Search
CPC ............. H05K 1/0373; H05K 1/115; H05K 2201/0195; H05K 2201/0209; H05K 2201/068
See application file for complete search history.

(56) References Cited

U.S. PATENT DOCUMENTS

| | | |
|---|---|---|
| 4,229,550 A | 10/1980 | Jones |
| 5,164,472 A | 11/1992 | White et al. |
| 5,275,853 A | 1/1994 | Silvis et al. |
| 5,401,814 A | 3/1995 | Schomaker et al. |
| 5,464,924 A | 11/1995 | Silvis et al. |
| 5,548,034 A | 8/1996 | Afzali-Ardakani |
| 5,709,957 A | 1/1998 | Chiang et al. |
| 5,834,078 A | 11/1998 | Cavitt et al. |
| 5,965,245 A | 10/1999 | Okano et al. |
| 6,165,617 A | 12/2000 | Satoh et al. |
| 6,346,164 B1 | 2/2002 | Nakamura et al. |
| 6,440,567 B1 | 8/2002 | Choate et al. |
| 6,805,958 B2 | 10/2004 | Nakamura et al. |
| 6,890,635 B2 | 5/2005 | Lin |
| 8,058,363 B2 | 11/2011 | Jian et al. |
| 8,581,107 B2 | 11/2013 | Hsu |
| 8,748,513 B2 | 6/2014 | Chen |

(Continued)

FOREIGN PATENT DOCUMENTS

| | | |
|---|---|---|
| JP | 2001234020 A | 8/2001 |
| JP | 2005075901 A | 3/2005 |

(Continued)

OTHER PUBLICATIONS

Office Action dated Mar. 28, 2023 in Japanese Patent Application No. 2023-037347 (with English translation), 6 pages.

(Continued)

*Primary Examiner* — Steven T Sawyer
(74) *Attorney, Agent, or Firm* — Element IP, PLC

(57) ABSTRACT

Described herein are dielectric polymer films and printed circuit boards, such as multilayer and high-density interconnect printed circuit board comprising at least one dielectric polymer film.

17 Claims, 1 Drawing Sheet

(56) References Cited

U.S. PATENT DOCUMENTS

| | | | |
|---|---|---|---|
| 9,265,160 | B2 | 2/2016 | Paul et al. |
| 9,966,164 | B2 | 5/2018 | Yamaguchi et al. |
| 10,194,524 | B1* | 1/2019 | Park .............. H05K 1/0218 |
| 10,233,365 | B2 | 3/2019 | Scholz et al. |
| 10,630,606 | B1* | 4/2020 | DiFerdinando ...... H04L 45/66 |
| 2001/0018986 | A1 | 9/2001 | Nagai et al. |
| 2003/0148107 | A1 | 8/2003 | Suzuki et al. |
| 2003/0194563 | A1 | 10/2003 | Shi et al. |
| 2004/0084304 | A1 | 5/2004 | Thompson |
| 2004/0099367 | A1 | 5/2004 | Nakamura et al. |
| 2005/0003199 | A1 | 1/2005 | Takaya et al. |
| 2005/0181215 | A1 | 8/2005 | Suzuki et al. |
| 2006/0065992 | A1 | 3/2006 | Hutchinson et al. |
| 2006/0292323 | A1 | 12/2006 | Hutchinson et al. |
| 2008/0014429 | A1 | 1/2008 | Su et al. |
| 2008/0107863 | A1 | 5/2008 | Ikeda et al. |
| 2008/0188153 | A1 | 8/2008 | Morin |
| 2009/0123642 | A1 | 5/2009 | Sato |
| 2009/0239992 | A1 | 9/2009 | Yamada |
| 2009/0298974 | A1 | 12/2009 | Chmielewski et al. |
| 2009/0321116 | A1 | 12/2009 | Arifuku et al. |
| 2010/0015404 | A1* | 1/2010 | Paul .............. H05K 1/0373 156/60 |
| 2010/0307803 | A1 | 12/2010 | Paul |
| 2010/0314160 | A1 | 12/2010 | Chang et al. |
| 2012/0155055 | A1* | 6/2012 | Kang ............ H01L 23/49811 29/830 |
| 2013/0062045 | A1* | 3/2013 | Chu .............. H05K 1/0373 165/185 |
| 2013/0303659 | A1 | 11/2013 | Wilson et al. |
| 2014/0102623 | A1 | 4/2014 | Kawai et al. |
| 2015/0274884 | A1 | 10/2015 | Nair |
| 2015/0284618 | A1 | 10/2015 | Esseghir et al. |
| 2016/0075839 | A1 | 3/2016 | Bedner et al. |
| 2016/0229965 | A1 | 8/2016 | Chmielewski et al. |
| 2016/0255717 | A1 | 9/2016 | Furutani et al. |
| 2016/0258862 | A1 | 9/2016 | Shin et al. |
| 2017/0064841 | A1 | 3/2017 | Han |
| 2017/0079134 | A1 | 3/2017 | Kuo et al. |
| 2017/0168391 | A1 | 6/2017 | Yoshida |
| 2018/0037700 | A1 | 2/2018 | Haldeman |
| 2018/0037703 | A1 | 2/2018 | Richardson et al. |
| 2019/0118508 | A1 | 4/2019 | Saito |
| 2019/0281697 | A1* | 9/2019 | Abe .............. H05K 3/4655 |
| 2020/0071464 | A1 | 3/2020 | Tanigawa et al. |
| 2020/0270395 | A1 | 8/2020 | Peer |
| 2020/0270413 | A1 | 8/2020 | Koes et al. |
| 2020/0344880 | A1 | 10/2020 | Uno et al. |
| 2020/0369855 | A1 | 11/2020 | Koes et al. |
| 2022/0025167 | A1 | 1/2022 | Lee et al. |
| 2022/0056225 | A1 | 2/2022 | Chen |
| 2022/0204696 | A1 | 6/2022 | Mizori |

FOREIGN PATENT DOCUMENTS

| | | |
|---|---|---|
| KR | 20210040414 A | 4/2021 |
| WO | 03051994 A2 | 6/2003 |
| WO | 2016201076 A1 | 12/2016 |
| WO | WO-2021241469 A1 | 12/2021 |
| WO | WO-2022239781 A1 | 11/2022 |

OTHER PUBLICATIONS

JP-2001234020-A, This reference was cited in the Japanese Office Action issued Mar. 28, 2023 in Patent Application No. 2023-037347 (with English translation).
JP-2005075901-A, This reference was cited in the Japanese Office Action dated Mar. 28, 2023 in Patent Application No. 2023-037347 (with English translation).
WO-2021241469A1, This reference was cited in the Japanese Office Action dated Mar. 28, 2023 in Patent Application No. 2023-037347 (with English translation).
WO-2022239781A1, This reference was cited in the Japanese Office Action dated Mar. 28, 2023 in Patent Application No. 2023-037347 (with English translation).
Brennan et al., "Poly(hydroxy amide ethers): new high-barrier thermoplastics," Macromolecules, 1996, 29: 3707-3716.
Deguchi, H., et al., "Examining the Required Properties of Build-up Dielectric Materials for Next Generation IC Package Substrates", ICEP-IAAC 2015 Proceedings, p. 623-627 (2015).
Diaham, S., et al., "Dielectric and Thermal Properties of Polyamide-imide {PAI} films", Annual Report Conference on Electrical Insulation and Dielectric Phenomena, p. 482-485 (2009).
Dielectric Constant of Plastic Materials (Year: 2021).
English Translation JP3579800B2 (Year: 1994).
Epoxy Resins, Ullmann's Encyclopedia of Industrial Chemistry, 2012, 170.
Final Office Action dated Jul. 7, 2021 for U.S. Appl. No. 17/153,194.
Final Office Action dated Dec. 29, 2021 for U.S. Appl. No. 17/153,194.
International Search Report and Written Opinion for International Application No. PCT/US2021/014088 dated Jul. 1, 2021.
Low Dielectric Poly (imide siloxane) films, Published Dec. 16, 2019 (Year: 2019).
Office Action dated Mar. 15, 2021 for U.S. Appl. No. 17/153,194.
Office Action dated Oct. 5, 2021 for U.S. Appl. No. 17/153,194.
Pubmed Compound Record for CID 22084909, '2-(Dimethylamino)-1-[1-[2-(dimethylamino)-1-hydroxyethoxy]ethoxy]ethanol', U.S. National Library of Medicine, 2007, 1-7 (https/pubchem.ncbi.nlm.nih.qov/compound/22084909).
International Search Report and Written Opinion dated Jun. 1, 2023 in PCT/US2023/014682, 7 pages.

* cited by examiner

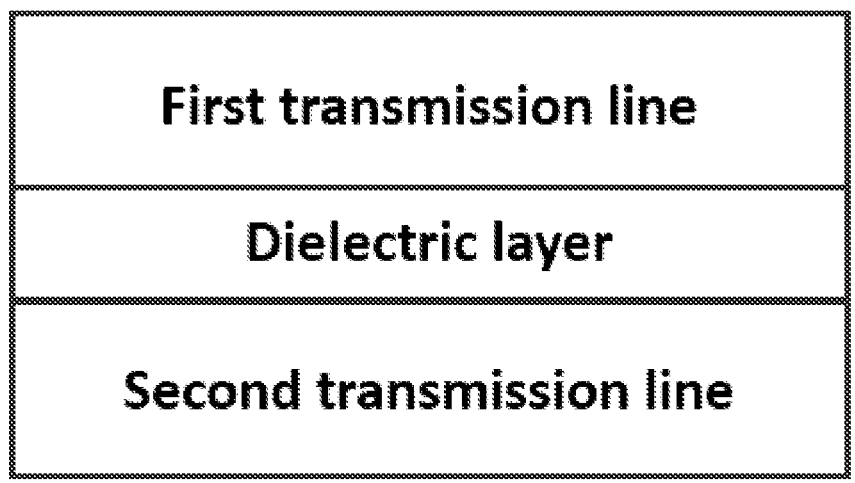

MATERIALS FOR PRINTED CIRCUIT BOARDS

CROSS REFERENCE TO RELATED APPLICATION(S)

The present application is a continuation of U.S. patent application Ser. No. 17/700,928, filed on Mar. 22, 2022, the entire disclosure of which is incorporated herein by reference.

BACKGROUND

Printed circuit boards including double sided, multilayer, flexible, and high-density interconnect printed circuit boards (HDI-PCB) generally include vias to interconnect different layers of the printed circuit board (PCB). For many systems in which multilayer PCBs, HDI-PCBs are used, it is desirable to reduce the area of the PCB while increasing its functionality. Such advancements are generally driven by miniaturization of components, driven by mobile computing, 4G and 5G applications, avionics, and military applications. To achieve these goals, successive generations of multilayer PCBs and HDI-PCBs have generally used thinner and thinner dielectric materials, and laser drilled microvias in the case of HDI or sequential lamination builds.

There are two major failure modes for the vias in PCBs: (1) overstress and (2) low cycle fatigue. Overstress can manifest itself during the reflow process where the temperature of the assembly is typically about 250° C. Multiple passes are generally required for the reflow and a combination of overstress and or cyclic fatigue can cause failure of the microvias. The second failure mode is low cycle fatigue (less than 1,000-10,000 cycles) caused by the service conditions, which may, in extreme cases, vary from −55° C. to 135° C. In both failure modes, the key driver of poor reliability is the large coefficient of thermal expansion (CTE) differential between the copper and the dielectric material. In PCBs, dielectric materials generally are composites of glass fabric and resin that have significant anisotropy in which the Z-axis CTE is much higher than in the X and Y directions since the dielectric material is constrained in the X and Y directions (or axis). The stress imposed on the copper interconnect by the Dielectric is a function of the CTE differential, the modulus of the dielectric, and the temperature excursion which the interconnect is subjected to. The approach so far with the state of the art has been developed to reduce the CTE differential by loading the polymer/resin used in the reinforced dielectric with fillers that help reduce the CTE and/or to increase the crosslink density.

Accordingly, the CTE goes down but is not low enough to completely reduce the stress, while there are unwanted consequences such as a higher glass transition temperature $T_g$ and a higher modulus. Additionally, since the dielectrics (prepregs and laminates) used are reinforced with woven or nonwoven fabrics, the dielectrics are inherently anisotropic. Typically, the Z-axis CTE is much higher than X and Y directions. The Z-axis modulus is dominated by the resin and is much lower as compared to that in the X and Y direction which is dominated by the reinforcement such as woven glass cloth. The anisotropy increases at $T_g$ when the CTEs in the X and Y axis drop significantly and the CTE in the Z axis goes up significantly by much more than would happen in an isotropic material. The Dielectric stays significantly stiff in the Z direction due to the presence of reinforcement. An isotropic film on the other hand is not subject to these effects. The current state of the art approach uses higher crosslink density and higher filler loading thereby increasing the modulus and the $T_g$. The net effect is that the stresses do not diminish much. To minimize the stress and resulting strain on the interconnect the quantity given by the product of the differential in CTE, multiplied with the modulus of the dielectric multiplied by the differential between the $T_g$ and lower end of the excursion needs to be minimized. The current state of the art only addresses reducing the differential in CTE an approach which results in the unwanted higher modulus and $T_g$. There is therefore a need for lower modulus and lower $T_g$ systems that can help reduce the interconnect stress.

There is also a need for printed circuit boards providing data channels (e.g., transmission lines) capable of supporting data rates greater than 28 Gbps (e.g., 56, 112, or 224 Gbps/channel). However, one obstacle to achieving such data rates at high fundamental frequencies (e.g., 8-56 GHz fundamental frequencies) is the channel loss of conventional transmission lines due to the conductor (e.g., copper) and the dielectric used to form and isolate the transmission lines. Currently, differential signaling is used with reinforced laminate materials, which have the issue of anisotropy and non-uniform dielectric properties. This approach leads to skew as each transmission line encounters a different effective dielectric constant due to the fiber weave effect. The bandwidth limitation imposed by the narrow conductor width (a result of relatively high dielectric constants) and the skew due to reinforcement lead to significant, potentially insurmountable problems with the state of the art in getting to higher data rates.

The current state of the art striplines used for data transmission range from 3.5-5 mil Dielectric thickness with 18-35-micron thick copper. The Dielectric constants (Dk) for the material are no lower than 3.0 at best for woven materials. This is facilitated through the use of low Dk glass. However, any attempts to lower the Dk through the use of lower Dk resin increases Skew. The Dielectric constant of the composite material is lowered but that of the reinforcement remains the same and that of the resin is lowered thereby increasing the gap between the Dk of the resin and the Dk of the reinforcement thereby increasing skew.

Accordingly, there is a need for high-reliability dielectric materials and printed circuit boards comprising the same that overcome these limitations.

SUMMARY

Described herein, in part, are dielectric layers and films and their use in printed circuit boards such as antenna, rigid-flex, flex, conventional and high-density interconnect (HDI) printed circuit boards (PCBs). The dielectric films of the present disclosure may, for example, may or may not be reinforced with glass fabric. In some embodiments, the layers and films each have low $T_g$, low modulus (e.g., Young's modulus, tensile modulus, or elastic modulus), and/or a low dielectric constant. In some embodiments, the layers and films may have a low dissipation factor.

It is known in the art that dielectric constants are relatively high in materials for buildup layers for use in multilayer printed circuit boards and HDI-PCBs. The present disclosure demonstrates, in part, that lower dielectric constant materials for PCB layers, particularly dielectric polymer films having a dielectric constant less than or equal to about 2.8, enable wider transmission lines for films of the same dielectric thickness, thereby reducing the insertion loss in the circuit board.

Furthermore, the glass transition temperature $T_g$ in a dielectric polymer film or layer described herein can be an analog of mechanical yield point. For example, the CTEs and the moduli of the dielectric films can change significantly above $T_g$. A lower $T_g$ is often associated with a lower yield strength of the dielectric film. Thus, the stress on the interconnect of a PCB (e.g., primarily copper) can be significantly reduced to be below the yield strength (e.g., of copper) as the film material reaches its $T_g$. Furthermore, the use of thermosetting films with low dielectric constant and/or low dissipation factor can enable the curing and C staging to be carried out at temperatures below 250° C.

The dielectric polymer films of the present disclosure are also characterized by a relatively low $T_g$ and a substantially isotropic relatively low modulus (e.g., a substantially isotropic Young's modulus of less than 6 GPa or 5 GPa), which, when taken together, have been shown to improve reliability of the printed circuit boards described herein, including reductions in overstress and low cycle fatigue as demonstrated by a reduced anisotropy of the CTE of the films, and less strain on the copper connections. In preferred embodiments, the $T_g$ of the dielectric film described herein is below 120° C. (e.g., below 100° C.). In preferred embodiments, the modulus of a dielectric film described herein is below 5 GPa. Furthermore, the dielectric polymer films of the disclosure may, in some embodiments, have a low dissipation factor (e.g., 0.005 or less), which has been advantageously found to reduce the dielectric loss, thereby reducing the insertion loss. The dielectric loss is directly proportional to the square root of the dielectric constant and the dissipation factor and the frequency of operations.

Materials having a lower dielectric constant and dissipation factor, when incorporated as dielectric layers and films into a printed circuit board, are therefore contemplated by the present disclosure to reduce insertion loss, thereby improving signal integrity. An additional benefit of the lower dielectric constant is that it increases the line width required for a certain design impedance. This imbues an additional benefit to the insertion loss. Furthermore, the conductor loss is inversely related to the line width. The wider the lines the lower the insertion loss. Lower Dk and Df therefore help with reducing not just the Dielectric loss but also the conductor loss. It is also contemplated herein that the use of wider lines due to lower dielectric constant also help to improve process yields, as there is an adverse impact on process yields while making printed circuit boards with thinner lines. As a result, a polymer film of the present disclosure may possess a relatively low dielectric constant, $T_g$, modulus, and/or dissipation factor as described above and confer the benefits associated with each property as described above. In other embodiments, a polymer film of the present disclosure may possess a relatively low dielectric constant, $T_g$, modulus, and dissipation factor as described above and may therefore confer the benefits of improved reliability by virtue of reduced stress on the interconnects such as vias and microvias as a direct result of lower modulus and $T_g$, a lower Dielectric loss due to low Dk and low Df of the film, a reduced conductor loss due to enablement of wider lines due to low dielectric constant and higher process yields enabled by the lower Dielectric constant of the film. These properties enable high density interconnect boards, ultra-high frequency of operation and ultrahigh data rates in a printed circuit board. The isotropic nature of the films helps avoid the skew problems as opposed to the current state of the art where reinforced Dielectrics are used in a printed circuit board. In another embodiment, the printed circuit boards of the present disclosure are also contemplated to enable higher data rates and higher frequency operation due to lower insertion loss, increased reliability and increased interconnect density. Thus, the present disclosure, in an embodiment, describes novel transmission lines that overcome the problems as described herein with the use of a unique configuration of low dielectric constant unreinforced films that allow the use of wider traces to extend the bandwidth of the communication channels with overall reduced thickness and without significant fiber weave skew.

In one aspect, described herein is a printed circuit board, comprising a dielectric layer comprising at least one dielectric polymer film, wherein the at least one dielectric polymer film has: (i) a glass transition temperature less than or equal to about 130° C.; (ii) a dielectric constant less than or equal to about 2.8; and (iii) a substantially isotropic elastic modulus less than or equal to about 6 GPa when the average temperature of the at least one dielectric polymer film is below the glass transition temperature.

In some embodiments, the dissipation factor of the at least one dielectric polymer film is from about 0.001 to about 0.005.

In some embodiments, the dielectric constant is from about 1.1 to about 2.5.

In some embodiments, the glass transition temperature is from about 25° C. to about 110° C.

In some embodiments, the elastic modulus less than or equal to about 4 GPa when the average temperature of the at least one dielectric polymer film is below the glass transition temperature.

In some embodiments, the at least one dielectric polymer film forms a part of transmission line structure of the printed circuit board.

In some embodiments, a dissipation factor of the transmission line is less than or equal to about 0.0025 at 5 GHz.

In some embodiments, a dissipation factor of the transmission line is less than or equal to about 0.0025 at 10 GHz.

In some embodiments, a width of the transmission line is greater than or equal to about 5 Mils.

In some embodiments, the transmission line is a first transmission line, wherein the at least one dielectric polymer film forms a second transmission line of the printed circuit board, and wherein a thickness of a dielectric layer between the first transmission line and the second transmission line is between 0.1 Mils and 4 Mils.

In some embodiments, the circuit board includes at least one component configured to transmit signals via the transmission line using pulse amplitude modulation (PAM).

In some embodiments, a number of pulse amplitude levels used in the pulse amplitude modulation is between 2 and 16.

In some embodiments, the circuit board includes at least one component configured to transmit data via the transmission line at a data rate greater than or equal to about 10 Gbps.

In some embodiments, the transmission line is one of a plurality of transmission lines formed from the dielectric polymer film, and wherein one or more components of the printed circuit board are configured to transmit data via each transmission line of the plurality of transmission lines at a data rate greater than or equal to about 10 Gbps.

In some embodiments, the circuit board is a component of a computational device or a networking device.

In some embodiments, the computational device is a desktop computer, laptop computer, server, tablet, accelerator, supercomputer, or mobile phone.

In some embodiments, the networking device is a switch, router, access point, or modem.

In some embodiments, the thermal conductivity of the dielectric layer or at least one polymer film is up to 4 w/mk.

In some embodiments, the dielectric polymer film is used to manufacture a double sided, or multilayer antenna.

In some embodiments, the dielectric polymer film is manufactured in films using continuous solvent cast process.

In some embodiments, the circuit board is a multilayer printed circuit board or high-density interconnect printed circuit board.

In some embodiments, a coefficient of thermal expansion of the dielectric polymer film is less than 200 ppm/° C. above $T_g$.

In some embodiments, a coefficient of thermal expansion of the dielectric polymer film is more than 200 ppm/° C. above $T_g$.

In some embodiments, the dielectric polymer film comprises a cross-linked polymer composition.

In another aspect, disclosed herein is a printed circuit board, comprising: a core layer; a dielectric layer disposed on a first side of the core layer, wherein the dielectric layer comprises at least one dielectric polymer film having: (i) a glass transition temperature less than or equal to about 130° C.; (ii) a dielectric constant less than or equal to about 2.8; and (iii) a substantially isotropic elastic modulus less than or equal to about 6 GPa when the average temperature of the at least one dielectric polymer film is below the glass transition temperature; and one or more microvias penetrating through the dielectric layer and connecting one or more respective pairs of conductive traces disposed on opposing sides of the dielectric layer.

In some embodiments, the dielectric layer reduces the risk of failure of the one or more microvias due to low cycle fatigue or overstress, as compared to when the dielectric layer is absent from the high-density interconnect printed circuit board.

In some embodiments, the core layer is a fiberglass-based dielectric or laminate.

In some embodiments, the dielectric layer is a first dielectric layer, and the high-density interconnect printed circuit board further comprises a second dielectric layer comprising the at least one dielectric polymer film.

In some embodiments, the circuit board further comprises one or more microvias penetrating through the second dielectric layer and connecting one or more respective pairs of conductive traces disposed on opposing sides of the second dielectric layer.

In some embodiments, the second dielectric layer is disposed on a second side of the core layer.

In some embodiments, the circuit board of claim further comprises: a third dielectric layer disposed on the first dielectric layer and comprising the at least one dielectric polymer film; and a fourth dielectric layer disposed on the second dielectric layer and comprising the at least one dielectric polymer film.

In some embodiments, the second dielectric layer is disposed on the first dielectric layer.

In some embodiments, the circuit board is a multilayer printed circuit board or high-density interconnect printed circuit board.

BRIEF DESCRIPTION OF THE DRAWING(S)

The FIG. schematically shows an example of the layout of a first transmission line and a second transmission line with a dielectric layer positioned between the first and second transmission lines.

DETAILED DESCRIPTION

This application refers to various issued patents, published patent applications, journal articles, and other publications, all of which are incorporated herein by reference. If there is a conflict between any of the incorporated references and the instant specification, the specification shall control.

Dielectric Materials and Films

Generally, the dielectric materials in the presently disclosed embodiments comprise a polymer composition. Dielectric materials include of the present disclosure, but are not limited to, a dielectric film, layer, or sheet as described herein.

A dielectric layer described herein may comprise, in some embodiments, one or more dielectric polymer films described herein. In some embodiments, a dielectric layer described herein may comprise one, two, three, four, or five dielectric polymer films described herein. In some embodiments, a dielectric layer described herein may comprise five dielectric polymer films or more described herein.

In some embodiments, the average thickness of a dielectric layer described herein is about 0.1 Mil to about 6.0 Mil (e.g., about 0.1 Mil to about 1.0 Mil, about 0.1 Mil to about 2.0 Mil, about 0.1 Mil to about 3.0 Mil, about 0.1 Mil to about 4.0 Mil, or about 0.1 Mil to about 5.0 Mil). In some embodiments, the average thickness of a dielectric layer described herein is about 0.25 Mil to about 2.5 Mil. In some embodiments, the average thickness of a dielectric layer described herein is about 0.5 Mil to about 2.0 Mil. In some embodiments, the average thickness of a dielectric layer described herein is about 0.5 Mil. In some embodiments, the average thickness of a dielectric layer described herein is about 1 Mil. In some embodiments, the average thickness of a dielectric layer described herein is about 5 Mil to about 125 Mil. In some embodiments, the average thickness of a dielectric layer described herein is about 0.1 Mil, 0.2 Mil, 0.3 Mil, 0.4 Mil, 0.5 Mil, 0.6 Mil, 0.7 Mil, 0.8 Mil, 0.9 Mil, 1.0 Mil, 1.1 Mil, 1.2 Mil, 1.3 Mil, 1.4 Mil, 1.5 Mil, 1.6 Mil, 1.7 Mil, 1.8 Mil, 1.9 Mil, 2.0 Mil, 3.0 Mil, 3.3 Mil, 3.5 Mil, 4.0 Mil, 5.0 Mil, or 6.0 Mil. In some embodiments, the average thickness of a dielectric layer described herein is about 5, 10, 15, 20, 25, 30, 35, 40, 50, 60, 70, 80, 90, 100, or 125 Mil.

The dielectric materials described herein may vary in properties such as, but not limited to, glass transition temperature ($T_g$), coefficient of thermal expansion (CTE), the dielectric constant, Young's modulus, film thickness, and thermal conductivity. Exemplary properties of the dielectric materials contemplated by the present disclosure are provided as follows:

In some embodiments, the dielectric films in the present disclosure can be carried on substrates such as copper foil or PET. Such copper foil can include a thickness of about 3 to about 35 microns. In some embodiments, the dielectric films can be coated with a 0.5-5.0-micron thick sputtered copper through e.g., a physical vapor deposition process. In some embodiments, the present disclosure includes laminates that are made by laminating copper foils coated with the dielectric films as described herein, followed by pressing them together through hot roll lamination of pressing using batch processing with a platen press.

Exemplary Polymers of the Present Disclosure

In an embodiment of the disclosure, a dielectric polymer film described herein comprises a cross-linked polymer composition. In some embodiments, the cross-linked polymer composition is present in the dielectric polymer film in an amount of about 50% by weight, 55% by weight, 60% by weight, 65% by weight, 70% by weight, 75% by weight, 80% by weight, 85% by weight, 90% by weight, 95% by weight, or 99% by weight based on the total weight of the film. Said cross-linked polymer compositions as described herein may, in some embodiments, comprise the cross-linked product of a thermosetting polymer. Said thermosetting polymers comprise one or more functional groups that are capable of cross-linking with other reactive groups to produce the cross-liked polymer composition.

In some embodiments, the functional group is a group that is reactive with a curing agent. In some embodiments, the functional group is a vinyl group. In some embodiments, the functional group is within the backbone of the thermosetting polymer (e.g., a backbone alkenyl group of a polybutadiene). In some embodiments, the functional group is grafted off of the thermosetting polymer. In some embodiments, the curing agent is a peroxide agent. In some embodiments, the thermosetting polymer and the curing agent react to form the cross-linked polymer composition in the presence of a catalyst. In some embodiments, the thermosetting polymer and the curing agent react to form the cross-linked polymer composition without the need for a catalyst. In some embodiments, reaction of the thermosetting polymer and the curing agent occurs under thermal conditions.

Curing agents of the present disclosure include but are not limited to those useful in initiating cure of the relevant polymers. Examples include, but are not limited to, azides, peroxides, diazo compounds, sulfur, and sulfur derivatives. Free radical agents are especially desirable as cure initiators. Examples of free radical agents include peroxides, hydroperoxides, and non-peroxide initiators such as, but not limited to, 2,3-dimethyl-2, 3-diphenyl butane. Examples of peroxide curing agents include dicumyl peroxide, alpha, alpha-di(t-butylperoxy)-m,p-diisopropylbenzene, 2,5-dimethyl-2,5-di(t-butylperoxy)hexane-3, and 2,5-dimethyl-2,5-di(t-butylperoxy)hexyne-3, and mixtures comprising one or more of the foregoing cure initiators. The cure initiator, when used, is typically present in an amount of about 0.25 wt. % to about 15 wt. %, based on the total weight of the thermosetting polymer to be cured.

In some embodiments, the thermosetting polymer is a high vinyl polymer resin (e.g., a polymer resin with greater than 70%, 80%, or 90% of its constituent units having vinyl groups). In some embodiments, the thermosetting polymer is a low vinyl polymer resin(e.g., a polymer resin with less than 70%, 60%, 50%, 40%, or 30% of its constituent units having vinyl groups).

Examples of thermosetting polymers comprising functional groups capable of cross-linkers include but are not limited to polyalkylenes (e.g., polyethylene, polypropylene, polyisoprenes, polynorborenes, polyalkylene terephthalates (such as polyethylene terephthalate, polybutylene terephthalate)), polyalkenylenes such as polybutadienes, and styrenes (e.g., impact-modified polystyrene, acrylonitrile-butadiene-styrene, styrene-acrylonitrile), or their grafted derivatives (e.g, polyethylene grafted with maleic anhydride).

In some embodiments, the thermosetting polymer is capable of cross-linking with another thermosetting polymer without a cross-linking agent to produce the cross-linked polymer composition. Examples of thermosetting polymers that cross-link with other polymers include polyalkenylenes (e.g, polybutadienes) and polyalkynylenes, and their derivatives (e.g., silicon modified).

Examples of thermosetting polymers comprising functional groups capable of cross-linking cross-linkers include but are not limited to polyalkylenes (e.g., polyethylene, polypropylene, polyalkylene terephthalates (such as polyethylene terephthalate, polybutylene terephthalate)), polyalkenylenes such as polybutadienes, and styrenes (e.g., impact-modified polystyrene, acrylonitrile-butadiene-styrene, styrene-acrylonitrile).

The dielectric polymer films may also comprise, in some embodiments, cross-linking units a radical acceptor material resulting from cross-linking with the polymer. Acceptor materials can be incorporated into the formulation to modulate the mechanical, physical, or electrical properties of the dielectric materials in the cured, or uncured state, such as, for example, the brittleness, flow properties, the CTE, adhesion, or other desirable properties the dielectric film (e.g., acrylates, maleimides, vinyl monomers). In some embodiments the acceptor material is a vinyl containing epoxy compound. In some embodiments the acceptor materials is an acrylate or methacrylate monomer. In some embodiments the acceptor materials is bis-acrylate or bis methacrylate. In some embodiments the acceptor materials is poly-acrylate or poly-methacrylate. In some embodiments the acceptor material is bis-maleimide or a poly-maleimide. In some embodiments, the acceptor material is SA9000 (Polyphyenylene ether that has been end-capped with an arcylate).

In some embodiments, a thermosetting polymer composition described herein further comprises a poly(arylene ether). Exemplary poly(arylene ether)s of the present disclosure include, but are not limited to, poly(2,6-dimethyl-1,4-phenylene ether), poly(2,6-diethyl-1,4-phenylene ether), poly(2,6-dipropyl-1,4-phenylene ether), poly(2-methyl-6-allyl-1,4-phenylene ether), poly(di-tert-butyl-dimethoxy-1,4-phenylene ether), poly(2,6-dichloromethyl-1,4-phenylene ether, poly(2,6-dibromomethyl-1,4-phenylene ether), poly(2,6-di(2-chloroethyl)-1,4-phenylene ether), poly(2,6-di-tolyl-1,4-phenylene ether), poly(2,6-dichloro-1,4-phenylene ether), poly(2,6-diphenyl-1,4-phenylene ether), and poly(2,5-dimethyl-1,4-phenylene ether).

The polymer films further comprise a polybutadiene or polyisoprene polymer. A "polybutadiene or polyisoprene polymer" as used herein includes homopolymers derived from butadiene, homopolymers derived from isoprene, and copolymers derived from butadiene and/or isoprene and/or less than 50 weight percent (wt %) of a monomer co-curable with the butadiene and/or isoprene. Suitable monomers co-curable with butadiene and/or isoprene include monoethylenically unsaturated compounds such as acrylonitrile, ethacrylonitrile, methacrylonitrile, alpha-chloroacrylonitrile, beta-chloroacrylonitrile, alpha-bromoacrylonitrile, $C_{1-6}$ alkyl(meth)acrylates (for example, methyl (meth)acrylate, ethyl (meth)acrylate, n-butyl(meth)acrylate, n-propyl (meth)acrylate, and isopropyl(meth)acrylate), acrylamide, methacrylamide, maleimide, N-methyl maleimide, N-ethyl maleimide, itaconic acid, (meth)acrylic acid, alkenyl aromatic compounds as described below, and combinations comprising at least one of the foregoing monoethylenically unsaturated monomers.

The polymers described herein may be a homopolymer (for example, a polyalkylene or poly(arylene ether) homopolymer) or a copolymer, including a graft or a block copolymer. In some embodiments, the copolymer is an alternating copolymer. In some embodiments, the copolymer is a block copolymer.

In some embodiments, block copolymers comprise a block (A) derived from an alkenyl aromatic compound and a block (B) derived from a conjugated diene. The arrangement of blocks (A) and (B) includes linear and graft structures, including radial teleblock structures having branched chains. Examples of linear structures include diblock (A-B), triblock (A-B-A or B-A-B), tetrablock (A-B-A-B), and pentablock (A-B-A-B-A or B-A-B-A-B) structures as well as linear structures containing 6 or more blocks in total of A and B. Specific block copolymers include diblock, triblock, and tetrablock structures, and specifically the A-B diblock and A-B-A triblock structures.

In some embodiments, the compound used to provide block (A) is an alkenyl aromatic compound, such as, for example, one disclosed in U.S. Pat. No. 9,265,160, which is incorporated herein by reference. In some embodiments, the alkenyl aromatic compound is styrene.

In some embodiments, the conjugated dienes used to provide block (B) include 1,3-butadiene, 2-methyl-1,3-butadiene (isoprene), 2,3-dimethyl-1,3-butadiene, and 1,3-pentadiene, specifically 1,3-butadiene and isoprene. A combination of conjugated dienes can be used. The block (B) derived from a conjugated diene is optionally partially or fully hydrogenated.

Exemplary block copolymers comprising a block (A) derived from an alkenyl aromatic compound and block (B) derived from a conjugated diene include styrene-butadiene diblock copolymer (SB), styrene-butadiene-styrene triblock copolymer (SBS), styrene-isoprene diblock copolymer (SI), styrene-isoprene-styrene triblock copolymer (SIS), styrene-(ethylene-butylene)-styrene triblock copolymer (SEBS), styrene-(ethylene-propylene)-styrene triblock copolymer (SEPS), and styrene-(ethylene-butylene) diblock copolymer (SEB). Such polymers are commercially available, for example from Shell Chemical Corporation under the trade names KRATON D-1101, KRATON D-1102, KRATON D-1107, KRATON D-1111, KRATON D-1116, KRATON D-1117, KRATON D-1118, KRATON D-1119, KRATON D-1122, KRATON D-1135X, KRATON D-1184, KRATON D-1144X, KRATON D-1300X, KRATON D-4141, KRATON D-4158, KRATON G1726, and KRATON G-1652.

Other exemplary polymers that may be used in the dielectric films described herein are disclosed in U.S. Pat. Nos. 6,890,635 and 9,265,160, each of which are incorporated herein by reference.

Glass Transition Temperature ($T_g$) of Films

In some embodiments, the glass transition temperature $T_g$ of the dielectric material is up to about 5, 10, 15, 20, 25, 30, 35, 40, 45, 50, 55, 60, 65, 70, 75, 80, 85, 90, 95, 100, 105, 110, 115, 120, 125, or 130° C. In some embodiments, the $T_g$ of the dielectric material is less than or equal to about 130° C. In some embodiments, the $T_g$ of the dielectric material is less than or equal to about 120° C. In some embodiments, the $T_g$ of the dielectric material is less than or equal to about 110° C. In some embodiments, the $T_g$ of the dielectric material is less than or equal to about 100° C. In some embodiments, the $T_g$ of the dielectric material is less than or equal to about 90° C. In some embodiments, the $T_g$ of the dielectric material is less than or equal to about 80° C. In some embodiments, the $T_g$ of the dielectric material is less than or equal to about 70° C. In some embodiments, the $T_g$ of the dielectric material is less than or equal to about 60° C. In some embodiments, the $T_g$ of the dielectric material is less than or equal to about 50° C. In some embodiments, the $T_g$ of the dielectric material is less than or equal to about 40° C. In some embodiments, the $T_g$ of the dielectric material is less than or equal to about 30° C. In some embodiments, the $T_g$ of the dielectric material is less than or equal to about 25° C. In some embodiments, the $T_g$ of the dielectric material is less than or equal to about 20° C. In some embodiments, the $T_g$ of the dielectric material is less than or equal to about 10° C. In some embodiments, the $T_g$ of the dielectric material is less than or equal to about 5° C. In some embodiments, the $T_g$ of the dielectric material is from about 90° C. to 130° C. In some embodiments, the $T_g$ of the dielectric material is from about 90° C. to 120° C. In some embodiments, the $T_g$ of the dielectric material is from about 80° C. to 110° C. In some embodiments, the $T_g$ of the dielectric material is from about 70° C. to 100° C. In some embodiments, the $T_g$ of the dielectric material is from about 60° C. to 90° C. In some embodiments, the $T_g$ of the dielectric material is from about 50° C. to 80° C. In some embodiments, the $T_g$ of the dielectric material is from about 40° C. to 70° C. In some embodiments, the $T_g$ of the dielectric material is from about 30° C. to 60° C. In some embodiments, the $T_g$ of the dielectric material is from about 25° C. to 50° C. In some embodiments, the $T_g$ of the dielectric material is from about 20° C. to 50° C. In some embodiments, the $T_g$ of the dielectric material is from about 10° C. to 40° C. In some embodiments, the $T_g$ of the dielectric material is from about 5° C. to 40° C.

Coefficient of Thermal Expansion (CTE) of Films

In some embodiments, the coefficient of thermal expansion (CTE) of the dielectric material from 50 to 250° C. is up to about 50, 60, 70, 80, 90, 100, 110, 120, 130, 140, 150, 160, 170, 180, 190, 200, 210, 220, 230, 240, 250, 260, 270, 280, 290 or 300 ppm/° C. In some embodiments, the CTE is up to about 20, 30, 40, 50, 60, 70, 80, 90, 100, 110, 120, 130, 140, 150, 160, 170, 180, 190, 200, 210, 220, 230, 240, 250, 260, 270, 280, 290 or 300 ppm/° C. below the $T_g$ of the dielectric material. In some embodiments, the CTE is up to about 80, 90, 100, 110, 120, 130, 140, 150, 160, 170, 180, 190, 200, 210, 220, 230, 240, 240, 250, 260, 270, 280, 290 or 300 ppm/° C. above the $T_g$ of the dielectric material. In some embodiments, the CTE is up to about 50, 60, 70, 80, 90, 100, 110, 120, 130, 140, 150, 160, 170, 180, 190, 200, 210, 220, 230, 240, 250, 260, 270, 280, 290 or 300 ppm/° C. In some embodiments, the CTE is up to about 20, 30, 40, 50, 60, 70, 80, 90, 100, 110, 120, 130, 140, 150, 160, 170, 180, 190, 200, 210, 220, 230, 240, 250, 260, 270, 280, 290 or 300 ppm/° C. below the $T_g$ in a cured thermoset composition. In some embodiments, the coefficient of thermal expansion is about 80, 90, 100, 110, 120, 130, 140, 150, 160, 170, 180, 190, 200, 210, 220, 230, 240, 250, 260, 270, 280, 290 or 300 ppm/° C. above the $T_g$ in a cured thermoset composition. In some embodiments, the CTE of the dielectric material is less than or equal to 220 ppm/° C. below the $T_g$ of the dielectric material. In some embodiments, the CTE of the dielectric material is less than or equal to 200 ppm/° C. below the $T_g$ of the dielectric material. In some embodiments, the CTE of the dielectric material is less than or equal to 180 ppm/° C. below the $T_g$ of the dielectric material. In some embodiments, the CTE of the dielectric material is less than or equal to 160 ppm/° C. below the $T_g$ of the dielectric material. In some embodiments, the CTE of the dielectric material is less than or equal to 140 ppm/° C. below the $T_g$ of the dielectric material. In some embodiments, the CTE of the dielectric material is less than or equal to 120 ppm/° C. below the $T_g$ of the dielectric material. In some embodiments, the CTE of the dielectric material is less than or equal to 100 ppm/° C. below the $T_g$ of the dielectric material. In some embodiments, the CTE of the dielectric material is from about 90 to about 120 ppm/° C. below the $T_g$ of the dielectric material. In some embodiments, the CTE of the dielectric material is from about 120 to about 150 ppm/° C. below the $T_g$ of the dielectric material. In some embodiments, the CTE of the dielectric material is from about 70 to about 100 ppm/° C. below the $T_g$ of the dielectric material. In some embodiments, the CTE of the dielectric material is from about 60 to about 90 ppm/° C. below the $T_g$ of the dielectric material. In some embodiments, the CTE of the dielectric material is from about 20 to about 60 ppm/° C. below the $T_g$ of the dielectric material. In some embodiments, the CTE of the dielectric material is from about 10 to about 50 ppm/° C. below the $T_g$ of the dielectric material. In some embodiments, the CTE of the dielectric material is substantially isotropic.

Dielectric Constant (Dk) of Films

In some embodiments, the dielectric constant of a dielectric material described herein, such as a dielectric layer or film, is about 1.1, 1.2, 1.3, 1.4, 1.5, 1.6, 1.7, 1.8, 1.9, 2, 2.1, 2.2, 2.3, 2.4, 2.5, 2.6, 2.7, 2.8. In some embodiments, the dielectric constant of a cured thermoset composition in the presently disclosed embodiments is about 1, 1.1, 1.2, 1.3, 1.4, 1.5, 1.6, 1.7, 1.8, 1.9, 2, 2.1, 2.2, 2.3, 2.4, 2.5, 2.6, 2.7, or 2.8. In some embodiments, the dielectric constant is less than or equal to 2.8. In some embodiments, the dielectric constant is less than or equal to 2.7. In some embodiments, the dielectric constant is less than or equal to 2.6. In some embodiments, the dielectric constant is less than or equal to 2.5. In some embodiments, the dielectric constant is less than or equal to 2.4. In some embodiments, the dielectric constant is less than or equal to 2.3. In some embodiments, the dielectric constant is less than or equal to 2.2. In some embodiments, the dielectric constant is less than or equal to 2.1. In some embodiments, the dielectric constant is less than or equal to 2. In some embodiments, the dielectric constant is less than or equal to 1.9. In some embodiments, the dielectric constant is less than or equal to 1.8. In some embodiments, the dielectric constant is less than or equal to 1.7. In some embodiments, the dielectric constant is less than or equal to 1.6. In some embodiments, the dielectric constant is less than or equal to 1.5. In some embodiments, the dielectric constant is less than or equal to 1.4. In some embodiments, the dielectric constant is less than or equal to 1.3. In some embodiments, the dielectric constant is less than or equal to 1.2. In some embodiments, the dielectric constant is less than or equal to 1.1.

In some embodiments, the dielectric constant is from about 1.1 to about 2.8. In some embodiments, the dielectric constant is from about 2 to about 2.8. In some embodiments, the dielectric constant is from about 2.1 to about 2.8. In some embodiments, the dielectric constant is from about 2.2 to about 2.8. In some embodiments, the dielectric constant is from about 2.3 to about 2.8. In some embodiments, the dielectric constant is from about 2.4 to about 2.8. In some embodiments, the dielectric constant is from about 2.5 to about 2.8. In some embodiments, the dielectric constant is from about 2.6 to about 2.8. In some embodiments, the dielectric constant is from about 2.7 to about 2.8. In some embodiments, the dielectric constant is from about 2.1 to about 2.7. In some embodiments, the dielectric constant is from about 2.1 to about 2.6.

In some embodiments, the dielectric constant is from about 2 to about 2.5. In some embodiments, the dielectric constant is from about 2.1 to about 2.5. In some embodiments, the dielectric constant is from about 2.2 to about 2.5. In some embodiments, the dielectric constant is from about 2.3 to about 2.5. In some embodiments, the dielectric constant is from about 2.4 to about 2.5. In some embodiments, the dielectric constant is from about 2 to about 2.4. In some embodiments, the dielectric constant is from about 2.1 to about 2.4. In some embodiments, the dielectric constant is from about 2.2 to about 2.4. In some embodiments, the dielectric constant is from about 2.3 to about 2.4. In some embodiments, the dielectric constant is from about 2 to about 2.3. In some embodiments, the dielectric constant is from about 2.1 to about 2.3. In some embodiments, the dielectric constant is from about 2.2 to about 2.3. In some embodiments, the dielectric constant is from about 2 to about 2.2. In some embodiments, the dielectric constant is from about 2.1 to about 2.2.

In some embodiments, the dielectric materials in the present disclosure can be filled with glass microspheres to further reduce the dielectric constant to 1.8-2.5.

In some embodiments, the dielectric constant of the dielectric material is substantially isotropic. In some embodiments, the dielectric constant of the dielectric material is measured at about 1, 5, or 10 GHz. In preferred embodiments, the dielectric constant of the dielectric material is measured at about 5 GHz.

Dissipation Factor (or DF) of Films

In some embodiments, the dissipation factor of the dielectric material is up to about 0.01, 0.009, 0.008, 0.007, 0.006, 0.005, 0.004, 0.005, 0.004, 0.003, 0.002, or 0.001. In some embodiments, the dissipation factor of the dielectric material is less than or equal to 0.005. In some embodiments, the dissipation factor of the dielectric material is less than or equal to 0.004. In some embodiments, the dissipation factor of the dielectric material is less than or equal to 0.003. In some embodiments, the dissipation factor of the dielectric material is less than or equal to 0.002. In some embodiments, the dissipation factor of the dielectric material is less than or equal to 0.001. In some embodiments, the dissipation factor of the dielectric material is from about 0.001 to about 0.005. In some embodiments, the dissipation factor of the dielectric material is from about 0.0015 to about 0.0025. In some embodiments, the dissipation factor of the dielectric material is from about 0.002 to about 0.005. In some embodiments, the dissipation factor of the dielectric material is from about 0.003 to about 0.005. In some embodiments, the dissipation factor of the dielectric material is from about 0.004 to about 0.005.

In some embodiments, the dissipation factor of the dielectric material is substantially isotropic. In some embodiments, the dissipation factor of the dielectric material is measured at about 1, 5, or 10 GHz. In preferred embodiments, the dissipation factor of the dielectric material is measured at about 5 GHz.

Young's Modulus (or Elastic Modulus) of Films

In some embodiments, the Young's modulus (also referred to as tensile or elastic modulus) of the dielectric material and/or the polymer composition is about 0.1, 0.2, 0.3, 0.4, 0.5, 0.6, 0.7, 0.8, 0.9, 1, 1.5, 2, 3, 4, 5, 6 GPa. In some embodiments, the Young's modulus of a cured thermoset composition in the presently disclosed embodiments is about 0.1, 0.2, 0.3, 0.4, 0.5, 0.6, 0.7, 0.8, 0.9, 1, 1.5, 2, 3, 4, 5, 6 GPa. In some embodiments, the Young's modulus is less than or equal to about 6 GPa. In some embodiments, the Young's modulus is less than or equal to about 5 Gpa. In some embodiments, the Young's modulus is less than or equal to about 4 Gpa. In some embodiments, the Young's modulus is less than or equal to about 3 Gpa. In some embodiments, the Young's modulus is less than or equal to about 2 Gpa. In some embodiments, the Young's modulus is less than or equal to about 1 Gpa. In some embodiments, the Young's modulus is from about 0.1 GPa to about 6 GPa. In some embodiments, the Young's modulus is from about 0.1 GPa to about 5 GPa. In some embodiments, the Young's modulus is from about 0.1 GPa to about 3 GPa. In some embodiments, the Young's modulus is from about 0.1 GPa to about 2 GPa. In some embodiments, the Young's modulus of the dielectric material is substantially isotropic.

In some embodiments, the dielectric material is a dielectric film, wherein the thickness of the dielectric film is from about 0.25 thousandth of an inch (Mil) to about 125 Mil. In some embodiments, the thickness is greater than or equal to 1 micrometer (µm). In some embodiments, individual films or sheets the dielectric material and/or the polymer composition are stacked and pressed to achieve a thickness of about 10 Mil to about 125 Mil.

In some embodiments, the dielectric material includes a thickness variance of up to about 1%, 2%, 3%, 4%, 5%, 6%, 7%, 8%, 9%, or 10%. In some embodiments, the thickness variance is less than or equal to about 10%. In some embodiments, the thickness variance is less than or equal to about 9%. In some embodiments, the thickness variance is less than or equal to about 8%. In some embodiments, the thickness variance is less than or equal to about 7%. In some embodiments, the thickness variance is less than or equal to about 6%. In some embodiments, the thickness variance is less than or equal to about 5%. In some embodiments, the thickness variance is less than or equal to about 4%. In some embodiments, the thickness variance is less than or equal to about 3%. In some embodiments, the thickness variance is less than or equal to about 2%. In some embodiments, the thickness variance is less than or equal to about 1%. In some embodiments, the thickness variance is from about 1% to about 10%. In some embodiments, the thickness variance is from about 2% to about 9%. In some embodiments, the thickness variance is from about 3% to about 8%. In some embodiments, the thickness variance is from about 4% to about 7%.

Fillers

In some embodiments, the at least one dielectric layer further comprises a filler. In some embodiments, the filler is selected from the group consisting of aluminum hydroxide, magnesium hydroxide, kaolin, talcum, hydrotalcite, calcium silicate, beryllium oxide, boron nitride, glass powder, silica powder, zinc borate, aluminum nitride, silicon nitride, carborundum, magnesium oxide, zirconium oxide zirconium oxide, mullite, titanium oxide, potassium titanate, hollow glass micro-bead, potassium titanate fiber, carborundum single crystal filament, silicon nitride fiber, alumina single crystal fiber, staple glass fiber, polytetrafluorethylene powder, polyphenylene sulfide powder, polystyrene powder, and combinations thereof. In some embodiments, the dielectric layer further comprises a flame retardant additive. In some embodiments, the flame retardant additive is a non-halogenated flame retardant additive. In some embodiments, the non-halogenated flame retardant is selected from the group consisting of a phosphorous-based flame retardant additive, an inorganic-based flame-retardant additive, and a combination thereof. In some embodiments, the at least one dielectric layer further comprises an auxiliary agent selected from the group consisting of heat stabilizers, light stabilizers, ultra-violet light absorbers, anti-oxidants, radical stabilizer, anti-static agents, preservatives, adhesion promoters, toughening agents, rubber particles, pigments, dyes, lubricants, mold releasers, blowing agents, fungicides, plasticizers, processing aids, acid scavengers, dyes, pigments, stabilizers, blowing agents, nucleating agents, nanotubes, wetting agents, dispersing agents, synergists, mineral fillers, reinforcing agents, whiskers, inorganic fillers, smoke suppressants, and combinations thereof. In some embodiments, the at least one dielectric layer further comprises one or more metal-filled microvias that penetrate the dielectric layer.

The dielectric films in the present disclosure can be made, in some embodiments, using combinations of materials, such as functionalized PPE, such as SA9000 available from Sabic corporation, Triallyl isocyanurate, available from Evonik, Tri allyl cyanurate available from Evonik, and other manufacturers, Cyanate Ester and Bismaleimide Resins such as BMI 5100 available from Daiwa Kasei corporation, GMI 2300 available from Shin-A T&C (Korea), XAD-620 from Shin-A T&C (Korea). In some embodiments, organic fillers, such as high impact polystyrene, PTFE powders, or inorganic fillers such as fused silica, titanium dioxide, silicon nitride, aluminum nitride, boron nitride are added to the dielectric films to improve CTE, thermal conductivity, and/or other properties. Spherical or no spherical fillers (e.g., spherical silica), including hollow spherical fillers, may also be used. Flame retardant such as Exolit® OP935 or Exolit® OP945 Aluminum Poly Phosphinate available from Clariant corporation, SPB100 or Phosphazene available from Otsuka chemical corporation can also be used as a flame retardant for halogen free applications. Other Phosphorated compounds such as Altexia from Albemarle or PQ 60 from Chin Yee chemicals may also be used, alone or in combination with other flame retardants. Halogenated flame retardants such as Saytex 8010, Ethylene-1,2-bis(pentabromophenyl) or BT 93 from Albemarle corporation can be used. Copolymers of butadiene and styrene such as Ricon 100, Ricon 184, Ricon 257 and Polymer of butadienes such as Ricon 300, Ricon, 130, Ricon 131, Ricon 134, Ricon 154, Ricon 156, and Ricon 157 available from Total can be used to crosslink or as a backbone for the dielectric films. In some embodiments, peroxide curing agents can be used in a curing process.

In some embodiments, a filler of the present disclosure may be may be present in the dielectric films from: 0 to 0.1% by weight based on the weight of the dielectric film, 0 to 0.5% by weight based on the weight of the dielectric film, 0 to 1% by weight based on the weight of the dielectric film, 0 to 5% by weight based on the weight of the dielectric film, 1 to 5% by weight based on the weight of the dielectric film, 1 to 6% by weight based on the weight of the dielectric film, 1 to 7% by weight based on the weight of the dielectric film, 1 to 8% by weight based on the weight of the dielectric film, 1 to 9% by weight based on the weight of the dielectric film, 1 to 10% by weight based on the weight of the dielectric film, 10 to 20% by weight based on the weight of the dielectric film, 20 to 30% by weight based on the weight of the dielectric film, 30 to 40% by weight based on the weight of the dielectric film, 40 to 50% by weight based on the weight of the dielectric film, 50% to 60% by weight based on the weight of the dielectric film, 60% to 70% by weight based on the weight of the dielectric film, or up to 70% weight based on the weight of the dielectric film. In some embodiments, a filler of the present disclosure may be may be present in a dielectric film of the present disclosure in an amount of 0, 0.0001, 0.001, 0.01, 0.02, 0.03, 0.04, 0.05, 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, or 60 weight percent based on the weight of the dielectric film.

Film Thickness

In some embodiments, the average thickness of a dielectric polymer film described herein is about 0.1 Mil to about 6.0 Mil (e.g., about 0.1 Mil to about 1.0 Mil, about 0.1 Mil to about 2.0 Mil, about 0.1 Mil to about 3.0 Mil, about 0.1 Mil to about 4.0 Mil, or about 0.1 Mil to about 5.0 Mil). In some embodiments, the average thickness of a dielectric polymer film described herein is about 0.25 Mil to about 2.5 Mil. In some embodiments, the average thickness of a dielectric polymer film described herein is about 0.5 Mil to about 2.0 Mil. In some embodiments, the average thickness of a dielectric polymer film described herein is about 3.0 Mil to about 5.0 Mil. In some embodiments, the average thickness of a dielectric polymer film described herein is about 0.5 Mil. In some embodiments, the average thickness of a dielectric polymer film described herein is about 1 Mil. In some embodiments, the average thickness of a dielectric polymer film described herein is about 1.5 Mil. In some embodiments, the average thickness of a dielectric polymer film described herein is about 5 Mil to about 125 Mil. In some embodiments, the average thickness of a dielectric polymer film described herein is about 0.1 Mil, 0.2 Mil, 0.3 Mil, 0.4 Mil, 0.5 Mil, 0.6 Mil, 0.7 Mil, 0.8 Mil, 0.9 Mil, 1.0 Mil, 1.1 Mil, 1.2 Mil, 1.3 Mil, 1.4 Mil, 1.5 Mil, 1.6 Mil, 1.7 Mil, 1.8 Mil, 1.9 Mil, 2.0 Mil, 3.0 Mil, 3.3 Mil, 3.5 Mil, 4.0 Mil, 5.0 Mil, or 6.0 Mil.

Peel Strength

In some embodiments, the average peel strength of the film onto an adhered surface (e.g., onto a metal laminate) is from about 1-10 lb/in, 2-10 lb/in, 3-10, 4-10, 5-10, 6-10, 7-10, 8-10, or 9-10 lb/in. In some embodiments, the average peel strength of the film onto an adhered surface (e.g., onto a metal laminate) is from about 3-6 lb/in, 4-6 lb/in, or 5-6 lb/in.

Method of Manufacturing Dielectric Materials

Provided herein are methods of manufacturing dielectric materials as described above. In some embodiments, provided herein are methods of manufacturing a sheet or film of dielectric materials. In some embodiments, methods of making sheets and films described herein include solvent casting, melt extrusion, lamination, and coating methods. Non-limiting examples of solvent casting, melt extrusion, lamination, and coating methods can be found, for example, in U.S. Patent Application Publication Nos. US 2009/0050842, US 2009/0054638, and US 2009/0096962, the contents of which are incorporated herein by reference. Further examples of solvent casting, melt extrusion, lamination, and coating methods to form films can be found, for example, in U.S. Pat. Nos. 4,592,885 and 7,172,713, and U.S. Patent Application Publication Nos. US 2005/0133953 and US 2010/0055356, the contents of which are incorporated herein by reference.

The continuous solvent cast process is the preferred method for providing thin films of the dielectric materials described herein. The solvent casting process is capable of providing the compositions with extremely high quality and of uniform thickness. A typical solvent casting process involves 1) dissolving and/or dispersing the components (e.g., polymer, crosslinker, filler, flame retardant, etc.) in a solvent to create a varnish; 2) coating the varnish on a substrate (e.g., copper foil) or casting film (e.g., PET); and 3) evaporation/removal of the solvent via drying (e.g., drying with a drying oven) to yield a film of the polymer composition on a substrate or carrier film. The final thickness of the film can be controlled, for example, by passing the varnish through a slot die. In order for the casting process to yield a high-quality film, it is important that the polymer dissolves in the varnish solvent. The residence time and temperature profile of the drying oven will dictate factors such as the amount of residual solvent retained in the film and whether the film is a cross-linked polymer composition or if it remains an admixture (e.g., has thermoplastic qualities). In some embodiments, the polymer composition is a thermoplastic polymer (or thermosetting) composition after the film casting and drying process. In some embodiments, the polymer composition is a crosslinked thermoplastic composition after the film casting and drying process.

In some embodiments, the sheet or film is provided on a carrier, or release, film, such as, but not limited to, PET, release treated PET, biaxially oriented polypropylene, and other common carrier or release liners. In some embodiments the sheet or film is provided on a copper foil. In some embodiments, the film of the polymer composition is tack-free to the touch. In some embodiments, in some embodiments the polymer film composition possesses sufficient plasticity such that it can be peeled off the carrier film and placed on an object. In some embodiments, the composition on a carrier film can be placed on a substrate, passed through a roll laminator, and then the carrier film peeled away leaving the polymer composition on the new substrate. In some embodiments, the substrate to be laminated is a copper foil or sheet. In some embodiments, the substrate to be laminated is a coper clad (etched, partially etched, or no etch), or copper unclad fiberglass core. In some embodiments, the sheet or film is metal clad (e.g., copper) or unclad. In some embodiments, the sheet or film is unreinforced (e.g., not reinforced, not comprising woven or non-woven glass fabric, organic woven or non-woven).

In some embodiments, the polymer composition is dispersed in a solvent and provide as a vanish composition. In some embodiments, the varnish composition is stable for days (e.g., before the varnish gels due to the crosslinking of the polymer and the crosslinking agent). In some embodiments, the varnish composition is stable for weeks before gelling occurs. In some embodiments, the varnish composition is stable for months before gelling occurs. In some embodiments the varnish composition is casted on to a carrier film. In some embodiments, the carrier film is polyethylene terephthalate (PET) or PET that has been treated to further facilitate the release of the polymer composition. In some embodiments, the varnish composition is casted on to copper foil.

In preferred embodiments, the dielectric films in the present disclosure can be carried on substrates such as copper foil or PET. Such copper foil can include a thickness of about 3 to about 35 microns. In some embodiments, the dielectric films can be coated with a 0.5-5.0-micron thick sputtered copper through e.g., a physical vapor deposition process. In some embodiments, the present disclosure includes laminates that are made by laminating copper foils coated with the dielectric films as described herein, followed by pressing them together through hot roll lamination of pressing using batch processing with a platen press.

Printed Circuit Boards Comprising Transmission Lines Formed from Dielectric Polymer Film In an embodiment, provided herein is a printed circuit board comprising one or more transmission lines formed of a composition as described herein (e.g., a dielectric polymer film).

The transmission line may be used as any type of conductive line (e.g., high-speed conductive line). In some examples, at least one of the transmission lines is formed in or on an outer layer of the PCB (e.g., as microstrip of microstrip transmission line). In some examples, at least one of the transmission lines is formed in or on an inner layer of the PCB (e.g., as a stripline). The transmission line may be single-ended or differential.

At a signal frequency (e.g., signal transmission rate) of 10 GHz, the dissipation factor of at least one of the transmission lines may be 0.0010, 0.0015, 0.0020, 0.0021, 0.0022, 0.0023, 0.0024, 0.0025, 0.0026, 0.0027, 0.0028, 0.0029, 0.0030, 0.0035, or 0.0040.

The width of at least one of the transmission lines may be between 1 and 4 Mils, between 4 and 6 Mils (e.g., 4.0, 4.1, 4.2, 4.3, 4.4, 4.5, 4.6, 4.7, 4.8, 4.9, 5.0, 5.1, 5.2, 5.3, 5.4, 5.5, 5.6, 5.7, 5.8, 5.9 or 6.0 Mils), or greater than 6 Mils (e.g., between 6 and 20 Mils). The unit "Mil" or "mil" refers to $\frac{1}{1000}$ of an inch.

In some examples, transmission lines (e.g., a first transmission line and a second transmission line) may be formed in vertically adjacent layers of the PCB. In such examples, the thickness of a dielectric layer between the first transmission line and the second transmission line may be less than 3 Mils (e.g., between 0.1 Mils and 3 Mils), between 3 Mils and 5 Mils (e.g., 3.0, 3.1, 3.2, 3.3., 3.4, 3.5, 3.6, 3.7, 3.8, 3.9, 4.0, 4.1, 4.2, 4.3, 4.4, 4.5, 4.6, 4.7, 4.8, 4.9, or 5.0 Mils), or greater than 5 Mils (e.g., between 5 and 20 Mils).

In some examples, the transmission line is capable of carrying signals modulated using any modulation scheme including, without limitation, pulse amplitude modulation (PAM). The number of pulse amplitude levels used in the pulse amplitude modulation scheme may be 2, 3, 4, 5, 6, 7, 8, 9, 10, 11, 12, 13, 14, 15, or 16.

In some examples, the transmission line is capable of carrying data at data rate between 28 and 224 Gbps (e.g., 28, 56, 112, or 224 Gbps).

In some embodiments, a PCB comprising one or more transmission lines formed of a composition as described herein may be flexible. The flexible PCB may, in some embodiments, have an elastic modulus between 0.01 GPa and 6 GPa (e.g., 1 GPa, 2 GPa, 3 GPa, 4 GPa, or 5 GPa). The flexible PCB may, in some embodiments, have an elastic modulus of less than or equal to 6 GPa (e.g., less than or equal to 1 GPa, less than or equal to 2 GPa, less than or equal to 3 GPa, less than or equal to 4 GPa, or less than or equal to 5 GPa). In some examples, the components of the flexible PCB may include one or more sensor devices (e.g., wearable sensors). In some embodiments, a PCB comprising one or more transmission lines formed of a composition as described herein may be used to create an antenna. For example, at least one dielectric polymer film may be used to manufacture a double sided, or multilayer antenna.

In some examples, the PCB is a component of a computational device (e.g., desktop computer, laptop computer, server, tablet, accelerator, supercomputer, mobile phone, etc.) or a networking device (e.g., switch, router, access point, modem, etc.). Such computational or networking devices may be configured to use the PCB to communicate with remote devices using any suitable wireless communication technology or standard (e.g., 4G, 5G, 6G, etc.).

For use in a process of manufacturing a PCB comprising one or more transmission lines formed of the dielectric polymer film, the film may be provided in bonding sheet form or in cured form (e.g., in the form of a c-stage core laminate).

Printed Circuit Boards Comprising Dielectric Materials

In an embodiment, provided herein is a printed circuit board comprising one or more insulating layers (also referred to herein as a "dielectric layer," "dielectric material," or "dielectric film"), wherein the insulating layer comprises a composition as described herein.

Advanced PCBs may include components embedded in the substrate (e.g., capacitors, resistors, or active devices). PCBs can be single sided (one copper layer), double sided (two copper layers) or multi-layer (e.g., multiple copper layer separated by dielectric materials) that allow high component density. Multilayer PCBs are complex composite structures generally comprising a series of layers of reinforced resin and copper foil. Conductors on different layers may be connected with "vias" or plated-through holes.

Laminates for PCB applications are manufactured via a process known as prepreging.

In some embodiments, the printed circuit board comprises a hybrid design, wherein the central core is a fiberglass-based dielectric (or laminate), and at least one, or a plurality, of the outer insulating layers comprise a polymer dielectric film. In some embodiments, the hybrid design has more than one fiberglass-based dielectric, and at least one, or a plurality, of the other insulating layers comprise a polymer dielectric film. In some embodiments, the printed circuit board is multilayered, double sided or single sided. In some embodiments, the sheet or film is used in a sequential build-up process. In some embodiments, the sheet or film is used in a sequential build-up process, where in the central core is fiberglass laminate.

A printed circuit board (e.g., an HDI-PCB) described herein may comprise one or more dielectric material (e.g., one or more dielectric films) as described herein and one or more copper layers.

In some embodiments, the stress below the $T_g$ of at least one of the one or more dielectric film is 15 to 30 MPa, or 15 to 20 MPa.

In some embodiments, the stress above the $T_g$ of at least one of the one or more dielectric film is 1 to 3 MPa (e.g., about 1.5 MPa).

The tensile stress imposed on the copper during assembly of a PCB (as in overstress failure mode) is given as:

$$\sigma_{Cu} = \int_{T_{amb}}^{T_{assem}} (\alpha_{Eq} - \alpha_{Cu}) \times E_{Cu} dT \qquad (1)$$

where $\sigma_{Cu}$ is the tensile stress in copper in the z-direction, $\alpha_{Eq}$ and $\sigma_{Cu}$ are the coefficients of thermal expansion in the z-direction for the equivalent material (dielectric and copper together) and for pure copper, respectively, $T_{assem}$ and $T_{amb}$ are the assembly temperature and the ambient temperature, respectively, and $E_{Cu}$ is the Young's modulus for the copper in the z-direction.

The equivalent coefficient of the dielectric material and copper is given by rule of mixtures as:

$$\alpha_{Eq} = \frac{(\alpha_{Di} V_{Di} E_{Di} + \alpha_{Cu} V_{Cu} E_{Cu})}{E_{Eq}} \qquad (2)$$

$$E_{Eq} = V_{Di} E_{Di} + V_{Cu} E_{Cu} \qquad (3)$$

where $E_{Di}$, $E_{Cu}$, and $E_{Eq}$ are the moduli for the dielectric, copper, and the equivalent material in the Z-direction, respectively, $\alpha_{Di}$, $\alpha_{Cu}$, and $\alpha_{Eq}$ are the z-direction coefficients of thermal expansion for the dielectric, copper, and the equivalent material, respectively, and $V_{Di}$ and $V_{Cu}$ are the volume fractions of the dielectric and the copper, respectively, in the area of influence in the circuit board.

The above equations can also be used for calculation above the glass transition temperature of the dielectric, $T_g$ by substituting appropriate quantities.

Since the coefficients of thermal expansion below $T_g$ and above $T_g$ as well as the moduli in the Z-direction can be approximated as constant valued, equation (1) can be rewritten as:

$$\sigma_{Cu} = (\alpha_{Eq_b} - \alpha_{Cu})(T_g - T_{amb})E_{Cu_g} + \alpha_{Cu} - \alpha_{Cu})(T_{yield} - T_g)$$
$$E_{Cu_g} + (\alpha_{Eq_a} - \alpha_{Cu})(T_{assem} - T_{yield})E_{Cu_p} \qquad (4)$$

where the subscript b indicates below $T_g$, the subscript a indicates above $T_g$, the subscript e indicates elastic, the subscript p indicates plastic, and $T_{yield}$ is the temperature at which the stress in the copper exceeds the yield stress for copper.

Stress/Strain During Thermal Cycling and Operating Conditions

The tensile stress imposed on the copper during operating conditions is given as:

$$\sigma_{Cu} = \int_{T_{LB}}^{T_{UB}} (\alpha_{Eq} - \alpha_{Cu}) E_{Cu} dT \quad (5)$$

where $T_{LB}$ and $T_{UB}$ are the lower and upper bound Temperatures respectively of the operating range.

Since the coefficients of thermal expansion below $T_g$ and above $T_g$ as well as the moduli in the Z-direction can be approximated as constant valued, equation (5) can be rewritten as:

a) If the upper bound is above $T_{yield}$, but below $T_g$:

$$\sigma_{Cu} = (\alpha_{Eq_b} - \alpha_{Cu})(T_{yield} - T_{LB}) E_{Cu_e} + (\alpha_{Eq_b} - \alpha_{Cu})(T_g - T_{yield}) E_{Cu_p} \quad (6)$$

b) If the upper bound of operating condition is below $T_{yield}$:

$$\sigma_{Cu} = (\alpha_{Eq_b} - \alpha_{Cu})(T_{uB} - T_{LB}) E_{Cu_e} \quad (7)$$

The total strain for the copper would be the sum of the elastic and plastic strain.

a) If the strain is plastic $$\varepsilon_{Cu} = \frac{\sigma_{Y,Cu}}{E_{Cu_e}} + \frac{\sigma_{Cu} - \sigma_{Y,Cu}}{E_{Cu_p}} \quad (8)$$

where $\varepsilon_{Cu}$ is the copper strain and $\sigma_{Y,Cu}$ is the yield stress for copper b) If the strain is elastic:

$$\varepsilon_{Cu} = \frac{\sigma_{Cu}}{E_{Cu_e}} \quad (9)$$

If equation (9) is applicable, implying that the copper strain is below yield, the failure mode changes to high cycle fatigue which is akin to almost infinite life in the context of the use of the device.

The dielectric materials as described herein can be used, for example in the printed circuit board industry. For example, dielectric films (not reinforced with glass fabric) with low $T_g$, low modulus, and/or low CTE in buildup layers can be used in, for example, high-density interconnect (UDI) printed circuit boards to enable higher reliability and increased interconnect density. In other embodiments, dielectric films enable the use of stacked vias which would survive assembly and have a high fatigue life under the desired operating conditions.

The benefits include more isotropic properties, homogeneity, and ability to reach dielectric thicknesses below 25 micrometers, improved dielectric spacing, enhancing adhesion to materials including metals such as copper, increased microvia reliability, toughening of the matrix and removal of the weave effect which plagues the woven fabric reinforced composites and causes skew or timing issues in high-speed digital transmission over printed circuit boards. High-density interconnect boards that are used for IOT devises, camera modules, infotainment systems, mobile phones, tablets and other consumer devices in addition to chip packaging, standard double and single sided boards, motherboards, sequential lamination boards, high and standard layer count boards, flexible boards would greatly benefit from the use of this new technology. Further, Potential improvement in lasability and increased throughput due to absence of glass, ability to breaking the dielectric thickness barrier, a potential 20-30% thickness reduction in boards, weight reduction for printed circuit boards, capability to decrease stresses on copper plated vias, reduced Z expansion increasing microvia reliability, thickness control an improved crack resistance are some of the benefits expected from the technology. These metal clad or unclad films or sheets also help solve the differential skew problems due to their homogenous, isotropic properties in the film or non-reinforced form (no woven reinforcements).

In some embodiments, a sheet or film of dielectric materials is provided on a carrier, or release, film, such as, but not limited to, PET, treated or surface modified PET, biaxially oriented polypropylene, and other common carrier or release liners. In some embodiments, the polymer compositions possess sufficient plasticity such that as films, they can be peeled off the carrier and placed on an object. In some embodiments, the composition on a carrier film can be placed on a substrate, passed through a laminator, and then the carrier film peeled away, leaving the polymer compositions on the new substrate. In some embodiments, the substrate to be laminated is a copper foil or sheet. In some embodiments, the substrate to be laminated is a coper clad (etched, partially etched, or no etch), or copper unclad fiberglass core. In some embodiments, the sheet or film is metal clad (e.g., copper) or unclad. In some embodiments, the sheet or film is unreinforced (e.g., not reinforced, not comprising woven or non-woven glass fabric, organic woven or non-woven fibers (e.g., micro or nano-sized inorganic or organic fillers)).

Methods of Manufacturing a PCB Comprising Dielectric Materials

In an embodiment, a procedure for forming laminates for printed circuit boards involves such operations as:

A. One or more sheets of prepreg are stacked or laid-up in alternating layers with one or more sheets of a conductive material, such as copper foil, if an electrical laminate is desired.

B. The laid-up sheets are pressed at elevated temperature and pressure for a time sufficient to fully bond the prepreg composition and form a laminate. The temperature of this lamination step is usually between 100° C. and 230° C. The lamination step is usually carried out for a time of from 1 minutes to 200 minutes, and most often between 10 minutes to 90 minutes. The lamination step may optionally be carried out at higher temperatures for shorter times (such as in continuous lamination processes) or for longer times at lower temperatures (such as in low energy press processes).

C. Optionally, the resulting laminate, for example, a copper-clad laminate, may be post-treated for a time at high temperature and ambient pressure. The temperature of post-treatment is usually between 120° C. and 250° C. The post-treatment usually is between 30 minutes and 12 hours.

In an embodiment, provided herein is a method of making or assembling a printed circuit board, comprising incorporation of a sheet or film as described herein. In some embodiments, said board is a high-density interconnect board (HDI board). In some embodiments, said board is used for semiconductor chip packaging applications. In some embodiments, the sheet or film serves the purpose of eliminating skew between differential lines. In some embodiments, the sheet or film is placed below the top copper sheet to eliminate pad cratering during lead free assembly. In some embodiments, the sheet or film is used for filling heavy copper (>3 Ounce/Sft) layers. In some embodiments the film is used to enhance the thermal conductivity for applications in packaging LEDs or for other high-power devices and in general for improving thermal conductivity in printed circuit boards. In some embodiments, the sheet or film clad on both sides is used for embedded capacitance layers. In some embodiments, the sheet or film is used for embedding silicon or other interposer materials used in 2.5 D chip packaging applications or other embedded component packaging.

In some embodiments, a printed circuit board is a high-density interconnect (HDI) printed circuit board. HDI printed circuit boards differ from other PCBs in the sense that HDI-PCBs use build-up technology in which a board is sequentially built-up layer-by-layer as opposed to conventional multilayer processes which use significantly fewer process steps. HDI is widely used for applications in which smaller sized circuit boards are preferred. For many systems in which HDI-PCBs are used, it is desirable to reduce the area of the PCB while increasing its functionality. Such advancements are generally driven by miniaturization of components, driven by mobile computing, 4 G and 5G applications, avionics, and military applications. To achieve these goals, successive generations of HDI-PCBs have generally used thinner and thinner dielectric materials, and laser drilled microvias.

In some embodiments, the printed circuit board is of the type 1+n+1, wherein the n layers can be a subassembly of multiple layers, in most cases the minimum value of n is 2 which means a double-sided core laminate. The 1 buildup layer on either side with these embodiments is made with the film comprising polymer. In some embodiments, the printed circuit board is multilayered, double sided or single sided. In some embodiments, the sheet or film is used in a sequential build-up process. In some embodiments the printed circuit board is a high-density interconnect (HDI) printed circuit board. In some embodiments, the high-density interconnect printed circuit board using buildup layers comprising polymer dielectric films is an i+n+i construction where i is greater than or equal to 2. In some embodiments, the buildup layers of the HDI 1+n+1 construction or i+n+i construction where i is greater than or equal to 2 use a polymer dielectric film with a thickness of between 0.25 Mil and 4 mil. In some embodiments the buildup layers comprising polymer are used for any-layer HDI boards and have a thickness between 0.25-4 Mils. In some embodiments, the buildup layers of the HDI 1+n+1 construction or i+n+i construction where i is greater than or equal to 2 or any-layer HDI are fabricated with subtractive etching techniques. In some embodiments, the buildup layers of the HDI 1+n+1 construction or i+n+i construction where i is greater than or equal to 2 or any-layer HDI are fabricated with modified semi additive (mSAP) or fully additive techniques. In some embodiments, the build-up layers comprising polymer dielectric films are sputtered with a thin layer of copper. In some embodiments the build-up layers have a nano layer of copper on one side of their surface.

There are also other methods that are used to make prepregs and laminates for PCB applications, such as hot melt method where a B-staged epoxy is melted and pressed on to the reinforcement substrate.

Dielectric layers of PCBs may contain via holes. In some embodiments, the via holes may be filled with sheet or film by placing them directly over the area that requires the fill, including holes, gap between traces or to encapsulate the traces. This would include use in conjunction with copper (e.g., heavy copper), where resin filling by other means is difficult. The resin filling can be carried out across the entirety of the board or focused on only small areas.

In some embodiments, a thin layer (e.g., a very thin layer) of the polymer composition is used between the metal (e.g., copper) and the thermoset or thermoplastic material to which the metal is to be bonded. In some embodiments, a thin layer (e.g., a very thin layer) of the polymer composition between the top metal layer of a printed circuit board and the thermoset or thermoplastic material to which the metal is to be bonded.

Definitions

Unless defined otherwise, all technical and scientific terms used herein have the same meaning as is commonly understood by one of ordinary skill in the art to which this disclosure pertains.

The articles "a" and "an" may be used herein to refer to one or to more than one (i.e. at least one) of the grammatical objects of the article. By way of example "an analogue" means one analogue or more than one analogue.

All ranges recited herein include the endpoints, including those that recite a range "between" two values.

As used herein, "about" will be understood by persons of ordinary skill in the art and will vary to some extent on the context in which it is used. If there are uses of the term which are not clear to persons of ordinary skill in the art given the context in which it is used, "about" will mean up to plus or minus 10% of the particular term.

As used herein, "thermoplastic" or "thermoplastic polymer composition" is understood to mean a plastic material or polymer that becomes pliable or moldable above a specific temperature and solidifies upon cooling.

As used herein, "thermoset," "thermosetting," "thermosetting material," or "thermosetting polymer composition" is understood to mean a polymer or resin in a soft solid or viscous state that changes irreversibly into an insoluble polymer network by curing and which, once hardened, cannot be reheated and melted back to a liquid form.

As used herein, "printed circuit board" refers to a mechanical support and electrically connected system of electronic, optical and/or opto-electronic components. For example, a printed circuit can be a primary insulating substrate (e.g., FR-4 glass epoxy) with a thin layer of copper foil lamination on one or both sides of the substrate. As used herein "printed circuit board component or part" refers to electronic, optical and/or opto-electronic components of the PCB, (e.g., electronic, optical, and/or opto-electronic components connected through conductive tracks, pads, or other features that may be etched from copper sheets laminated onto a non-conductive substrate).

As used herein, the term "microvia" may refer to a via through a single layer of a PCB. As used herein, "laminate" refers to a composite comprising one or more plies of pre-preg, which may be optionally clad with metal (e.g., copper) foil on one or more sides, that is formed into a final product by the application of heat and pressure. A laminate as described herein may be cured or uncured.

As used herein, "pre-preg" refers to a bonding layer of dielectric material which may or may not be reinforced. A polymer composition as described herein, may be used as prepreg for manufacturing the laminate. The thermoplastic polymer is used without any fibrous reinforcement. A pre-preg is also commonly called a bonding sheet.

As used herein, the term "substantially" means to a high degree of approximation (e.g., within +/−10% for quantifiable properties) but without requiring absolute precision or a perfect match.

As used herein, the terms "$T_g$" and "glass transition temperature" are used interchangeably herein.

EXAMPLES

The below Examples are offered to illustrate the embodiments described herein and are not to be construed in any way as limiting the scope of the embodiments.

Abbreviations: DK: dielectric constant; DF: dissipation factor; CTE: coefficient of thermal expansion.

Example 1—Fabrication and Properties of Dielectric Films

Specific examples of dielectric films with the combination of low $T_g$, low modulus, low dielectric constant, and low dissipation factor and some of their properties are given in Table 1. The compositions were obtained by either 1) compounding the components in a melt mixer apparatus (i.e., a solvent-free method); or 2) compounding in a solvent and uniformly dispersing in a high-speed rotary mixer to give a varnish; subsequently drawling down the varnish with a bar on top of a 2 mil PET film, and drying in the oven to a level of <1% retained solvent, to yield the composition as a film of about 1-3 mil thickness. The physical and electrical data were obtained by stacking piles of dielectric film and consolidated using a 6×6-inch hydraulic press at a pressure of 250 Psi, followed by being cured at 330° F. for 30 minutes to form a film including 0.6 mm in thickness. Ricon 257 is a low molecular weight, high vinyl butadiene-styrene copolymer manufactured by Total (USA). Ricon 154 is a low molecular weight, high vinyl polybutadiene resin manufactured by Total (USA). KR05 is high molecular weight, predominately 1,4-addition styrene butadiene copolymer manufactured by Ineos (Germany). SR8983 is high molecular weight, predominately 1,4-addition styrene butadiene copolymer manufactured by Lion Elastomers (USA). SA9000 is methacrylate terminated polyphenylene ether manufactured by SABIC (USA). GMI 5100 is a bis maleimide manufactured by SHIN-A T&C (Korea). The filler and phosphorous-based flame retardant OP935 is Exolit® OP935 manufactured by Clariant (Europe). GB are glass microspheres manufactured by 3M (USA). Fused silica is teco-sil-10manufacture by Imerys Refractory Minerals (USA). PTFE powder is SST-4 mg manufactured by Shamrock Technologies (USA). AGE is allyl glycidyl ether from Sigma Aldrich (USA). Dicup-R® is a peroxide catalyst manufactured by Arkema (USA). The reported Dk (dielectric constant) and Df (dissipation factor) values are at 5 GHz obtained with a split post dielectric resonator. The reported CTE values were obtained using a thermomechanical analyzer (TMA). The reported Young's Modulus and $T_g$ values were obtained using a dynamic mechanical analyzer instrument (DMA). The peel strength measurements correspond to one ounce copper weight values.

TABLE 1

| Components | Compound Amount (parts) | | | | | | |
|---|---|---|---|---|---|---|---|
| | Ex1 | Ex2 | Ex4 | Ex5 | Ex6 | Ex7 | Ex8 |
| Ricon 257 | 30 | 30 | 150 | 200 | 150 | 200 | 300 |
| Ricon 154 | | | | | | | |
| KR05 | | | | | | | |
| SR8983 | 100 | 100 | 100 | 100 | 100 | 100 | 100 |
| GMI 5100 | 4 | 4 | 5 | 5 | 4 | 5 | 7 |
| SA9000 | 10 | 20 | 18 | 22 | 18 | 18 | 29 |
| OP935 | 30 | 30 | 55 | 66 | | | 88 |
| Fused Silica | | | | | | | |
| PTFE powder | | | | | | | |
| GB | | | | | 45 | 50 | |
| Dicup-R | 2 | 2 | 3 | 4 | 3 | 4 | 5 |
| AGE | | | | | | | |
| DK | 2.51 | 2.51 | 2.48 | 2.49 | 2.14 | 2.18 | 2.48 |
| DF | .0022 | .0022 | .0025 | .0023 | .0025 | .0025 | .0023 |
| tensile modulus (Gpa) | .76 | .73 | 1.09 | .58 | 0.72 | .41 | .48 |
| tensile modulus @ $T_g$ (GPa) | .058 | .024 | .056 | .032 | .044 | .030 | .019 |
| CTE (ppm/° C. from 50-260° C.) | 200 | 222 | 120 | 238 | 115 | 148 | 213 |
| DMA $T_g$ (° C.) | 112 | 104 | 111 | 109 | 109 | 107 | 103 |
| Peel Strength (lb/in) | 2.9 | 4.1 | 3.5 | 4.3 | 2.9 | 3.2 | 3.9 |

TABLE 1-continued

| Components | Compound Amount (parts) | | | | | |
|---|---|---|---|---|---|---|
| | Ex9 | Ex10 | Ex11 | Ex12 | Ex13 | Ex14 |
| Ricon 257 | 300 | 30 | 30 | 30 | | 100 |
| Ricon 154 | | | | | 30 | |
| KR05 | | | | | | 30 |
| SR8983 | 100 | 100 | 100 | 100 | 100 | |
| GMI 5100 | 7 | 10 | 10 | 2.5 | | 10 |
| SA9000 | 28 | | | | 5 | 10 |
| OP935 | | 30 | 30 | | 29 | |
| Fused Silica | | 60 | 90 | | | |
| PTFE powder | | | | 40 | | |
| GB | 67 | | | | | |
| Dicup-R | 5 | 2 | 2 | 2 | 2 | |
| AGE | | 3 | 3 | | | |
| DK | 2.16 | 2.71 | 2.71 | 2.39 | 2.49 | 2.53 |
| DF | .0025 | .0026 | .0026 | .0018 | .0028 | .0022 |
| tensile modulus (Gpa) | .91 | .60 | .97 | | 1.73* | |
| tensile modulus @ $T_g$ (GPa) | 0.037 | .030 | .078 | | | |
| CTE (ppm/° C. from 50-260° C.) | 117 | 224 | 183 | 233 | | 239 |
| DMA $T_g$ (° C.) | 110 | 94 | 100 | | | |
| Peel Strength (lb/in) | 4.1 | 4.3 | 3.1 | 4.9 | 1.9 | 4.2 |

*Flexural modulus measured

Example 2—Properties in Dielectric Films of the Present Disclosure

Table 2 shows improved properties in dielectric films in the presently disclosed embodiments in comparison with known films in the art, resulting in improved PCB performance. The improved properties included reduced insertion loss ("Loss at 16 GHz dB/inch" in Table 2) and dielectric constants ("DK" in Table 2), as described below in further detail. The improved properties also included reduced stress ("Plastic Strain" in table 2) on vias and therefore increased PCB reliability.

Calculations Based on Dielectric Constant, Dissipation Factor, and Skew

The speed data in Table 2 was generated (e.g., by calculation) using commercial electronic design automation software, such as Gauss 2D and Gauss Stack, from Avishtech.

The insertion loss ac was calculated by the following equation:

$$\alpha_c = \frac{R_m \sqrt{\varepsilon}}{2Z_0} \frac{dZ_0}{dl}$$

where $R_m = \sqrt{\frac{\omega \mu}{2\sigma}}$,

ω is the angular frequency, μ is the magnetic permeability (e.g., equal to $4\pi \times 10^{-7}$ H/m for copper), σ is the electrical conductivity (which is equal to $5.88 \times 10^7$ S/m for copper), w is the width, $Z_0$ is the characteristic impedance, and ε is the permittivity of the material.

The current state of the art for comparison included 3.5 mil thick dielectrics and 0.5 ounce copper. The dielectric constants for the dielectric materials used in the state of the art may be at least 3.2 (e.g., 3.2, or 3.4), as shown in Table 2. The insertion loss for the dielectric materials used in the state of the art may be at least 1.24, as shown in Table 2. The transmission lines were run as differential pairs with an impedance of around 85-100 ohms. The state of the art may use woven glass fabric with low-dielectric constant ("DK" in Table 2) glass reinforcement, where the "DK" is a value of at least 3.2 and a $T_g$ of at least 170° C. in Table 2. Since the dielectric constants of glass and resin are quite dissimilar, this may lead to skew problems which can be mitigated to some extent by rotation or hardware such as re-timers.

In comparison, as also shown in Table 2, the dielectric films in the presently disclosed embodiments (e.g., Ex1, Ex2, and Ex4-Ex11) included non-fiber weave reinforced film with a dielectric constant equal to or less than 2.8 (e.g., 2.8, 2.6, 2.4, or 2.1), enabling a wider line without skew and reduced insertion loss, and enabling communications at faster rates for longer lengths.

Calculations Based on $T_g$/Modulus

Assumptions of copper properties and dimensions for an HDI-printed circuit board with copper filled vias are provided in Table 3.

TABLE 3

| Copper Properties | Value | Units |
|---|---|---|
| Modulus Elastic | 117 | GPa |
| Modulus Plastic | 1.15 | GPa |
| Poisson ratio | 0.35 | |
| CTE of Copper- 10–6 m/m | 17.6 | |
| Yield Strength | 65 | MPa |
| Yield Strain | 0.056 | Percent |
| Ambient | 25.000 | ° C. |
| Microvia dimensions | | |
| Outside diameter of the microvia | 0.1 | mm |
| Inner diameter of the micro via | filled | |
| Dielectric diameter of influence | 0.4 | mm |
| 0.5 mm pitch | | |
| Dielectric Volume Fraction | 0.938 | |
| Copper Volume Fraction | 0.063 | |

Sample calculations based on the parameters provided in Table 3 and the empirically derived physical properties of the dielectrics in Table 1 were performed. Table 4 illustrates a comparison of a PCB fabricated using a typical existing material with a 170° C. $T_g$ prepreg versus one made with a low Dk, DF, Modulus, and $T_g$ dielectric of Ex9 from Table 1.

elastic manner and is not subject to low cycle fatigue, indicating very high reliability. In contrast, a typical existing material as in use currently in the Art (in this case a 170° C. $T_g$ material prepreg) results in much higher stresses. These results show the possibility of failure due to overstress and fatigue due to plastic strain, when the current set of materials is used.

TABLE 2

|  | Dk @ 5 GHz | Df @ 5 GHz | Tensile Modulus Gpa | Tensile Modulus Gpa @ Tg | CTE PPM/° C. 50-260 | DMA Tg Deg C max Tan Delta | Line width 100 Ohms differential | Computed stress up to reflow 250° C. in copper | Plastic strain | Insertion loss dB/inch 16 GHz | Skew pS/ inch |
| --- | --- | --- | --- | --- | --- | --- | --- | --- | --- | --- | --- |
| State of the art High Tg | 3.2000 | 0.0025 | 6.00 | 0.1200 | 148.0 | 170.0 | 2.85 | 86.9 | 1.90% | 1.240 | 3.2 |
| Ex1 | 2.5059 | 0.0022 | 0.76 | 0.0584 | 200.0 | 112.0 | 3.55 | 77.5 | 1.09% | 0.990 | 0.0 |
| Ex2 | 2.5120 | 0.0022 | 0.73 | 0.0246 | 222.0 | 104.0 | 3.44 | 73.4 | 0.73% | 0.990 | 0.0 |
| Ex4 | 2.4847 | 0.0025 | 1.09 | 0.0560 | 120.0 | 111.0 | 3.48 | 65.1 | 0.01% | 1.000 | 0.0 |
| Ex5 | 2.4928 | 0.0023 | 0.58 | 0.0319 | 238.0 | 109.0 | 3.47 | 75.5 | 0.91% | 0.990 | 0.0 |
| Ex6 | 2.1366 | 0.0025 | 0.72 | 0.0436 | 115.0 | 109.0 | 4.04 | 39.5 | 0.00% | 0.880 | 0.0 |
| Ex7 | 2.1801 | 0.0025 | 0.41 | 0.0304 | 148.0 | 107.0 | 3.97 | 29.4 | 0.00% | 0.900 | 0.0 |
| Ex8 | 2.4794 | 0.0023 | 0.48 | 0.0194 | 213.0 | 103.0 | 3.49 | 45.9 | 0.00% | 0.980 | 0.0 |
| Ex9 | 2.1556 | 0.0025 | 0.91 | 0.0368 | 117.0 | 110.0 | 4.01 | 38.9 | 0.00% | 0.890 | 0.0 |
| Ex10 | 2.7100 | 0.0026 | 0.60 | 0.0295 | 224.0 | 94.0 | 3.18 | 65.1 | 0.01% | 1.080 | 0.0 |
| Ex11 | 2.7100 | 0.0027 | 0.97 | 0.0782 | 183.0 | 100.1 | 3.18 | 79.4 | 1.25% | 1.080 | 0.0 |

EX 6, 7, 8, 9 show no plastic strain which means very high reliability, other films show much lower plastic strain compared to the state of art which means chances of failure are greatly reduced.
The Insertion loss calculation are run for a 3.5 mil Dielectric at 16 GHz. All films show insertion loss below 1.1 dB/inch and most be low 1.0 db/inch

TABLE 4

| Dielectric material | State of the Art | Ex10 | |
| --- | --- | --- | --- |
| Tg of dielectric layer | 170 | 90.0 | ° C. |
| Ambient | 25.000 | 25.000 | ° C. |
| CTE of dielectric below Tg per ° C. | 60.00 | 117.00 | 10−6 m/m |
| CTE of prepreg dielectric above TG per ° C. | 264.00 | 117.00 | 10−6 m/m |
| Modulus of Resin below Tg | 6.00 | 0.47 | GPa |
| Modulus of the dielectric in Z direction | 6.00 | 0.47 | GPa |
| Modulus of the resin above Tg | 0.20 | 0.04 | GPa |
| CTE - Alpha 1 below Tg equivalent per ° C. below Copper yield | 35.52 | 22.74 | 10−6 m/m |
| CTE - Alpha 2 below copper elastic limit and above Tg equivalent per ° C. | 23.76 | 18.07 | 10−6 m/m |
| CTE - Alpha 2 above copper elastic limit and below Tg equivalent per ° C. | 59.47 | 103.15 | 10−6 m/m |
| CTE - Alpha 3 above Tg and copper elastic limit equivalent per ° C. | 195.72 | 49.82 | 10−6 m/m |
| Stress below Copper Yield | 65.00 | 39.07 | MPa |
| Stress above copper yield and below Tg | | | MPa |
| Stress above Tg to 250 | 86.88 | 38.90 | MPa |
| Total stress | 86.88 | 38.90 | MPa |
| Plastic Strain for reflow | 1.902 | 0.00% | Percent |

The use of a substantially isotropic, low $T_g$ and low Modulus, low Dk and Low Df films of the disclosure demonstrate data that show that the copper stresses stay below the yield strength, whereas with the existing higher $T_g$ materials in the Art, the stresses exceed the yield strength and lead to permanent deformation leading to early failure—in some cases, during assembly, itself. Since, for example, the stress calculated using the direction film Ex9 is lower than the yield stress of the copper, the copper behaves in an elastic manner and is not subject to low cycle fatigue, indicating very high reliability.

The stresses were calculated for other dielectrics films described in Table 1. As shown in Table 2, these substantially isotropic, low $T_g$, low modulus, low Dk and low Df materials possess either zero plastic strain, or substantially less plastic strain, when compared to state of the art, high $T_g$ materials. Additionally, as show in Table 2, this disclosure bestows lower insertion loss. Thus, demonstrating that both higher reliability and higher-speed PCB can be fabricated using this disclosure.

EQUIVALENTS

Those skilled in the art will recognize, or be able to ascertain, using no more than routine experimentation, numerous equivalents to the specific embodiments described specifically herein. Such equivalents are intended to be encompassed in the scope of the following claims.

What is claimed is:
1. A printed circuit board, comprising a transmission line, which contains a dielectric polymer film having:
    (i) a glass transition temperature less than or equal to about 130° C.;
    (ii) a dielectric constant less than 2.8; and
    (iii) a substantially isotropic elastic modulus less than or equal to about 6 GPa when an average temperature of the dielectric polymer film is below the glass transition temperature,
    wherein a width of the transmission line is greater than or equal to about 5 Mils.
2. The printed circuit board of claim 1, wherein the dielectric polymer film has a dissipation factor of about 0.001 to about 0.005.
3. The printed circuit board of claim 1, wherein the dielectric constant is from about 2 to about 2.5.
4. The printed circuit board of claim 1, wherein the glass transition temperature is from about 25° C. to about 110° C.

5. The printed circuit board of claim 1, wherein the elastic modulus is less than or equal to about 4 GPa when the average temperature of the dielectric polymer film is below the glass transition temperature.

6. The printed circuit board of claim 1, wherein a dissipation factor of the transmission line is less than or equal to about 0.0025 at 10 GHz.

7. A printed circuit board, comprising
a first transmission line;
a second transmission line; and
a dielectric layer between the first transmission line and the second transmission line,
wherein
the first transmission line and the second transmission line contain a dielectric polymer film having: (i) a glass transition temperature less than or equal to about 130° C., (ii) a dielectric constant less than 2.8, and (iii) a substantially isotropic elastic modulus less than or equal to about 6 GPa when an average temperature of the dielectric polymer film is below the glass transition temperature,
the first transmission line has a width greater than or equal to about 5 Mils, and
the dielectric layer between the first transmission line and the second transmission line has a thickness between 0.1 Mils and 4 Mils.

8. The printed circuit board of claim 1, further comprising at least one component configured to transmit signals via the transmission line using pulse amplitude modulation.

9. The printed circuit board of claim 8, wherein a number of pulse amplitude levels used in the pulse amplitude modulation is between 2 and 16.

10. The printed circuit board of claim 1, further comprising at least one component configured to transmit data via the transmission line at a data rate greater than or equal to about 10 Gbps.

11. The printed circuit board of claim 10, wherein the transmission line is one of a plurality of transmission lines containing the dielectric polymer film, and wherein one or more components of the printed circuit board are configured to transmit data via each transmission line of the plurality of transmission lines at a data rate greater than or equal to about 10 Gbps.

12. The printed circuit board of claim 1, which is a component of a computational device or a networking device.

13. The printed circuit board of claim 1, which is a component of a desktop computer, a laptop computer, a server, a tablet, an accelerator, a supercomputer, or a mobile phone.

14. The printed circuit board of claim 1, which is a component of a switch, a router, an access point, or a modem.

15. The printed circuit board of claim 1, wherein a thermal conductivity of the dielectric polymer film is less than or equal to 4 w/mk.

16. The printed circuit board of claim 1, which is a multilayer printed circuit board or high-density interconnect printed circuit board.

17. The printed circuit board of claim 1, wherein the dielectric polymer film comprises a cross-linked polymer composition.

* * * * *